Figure 1:
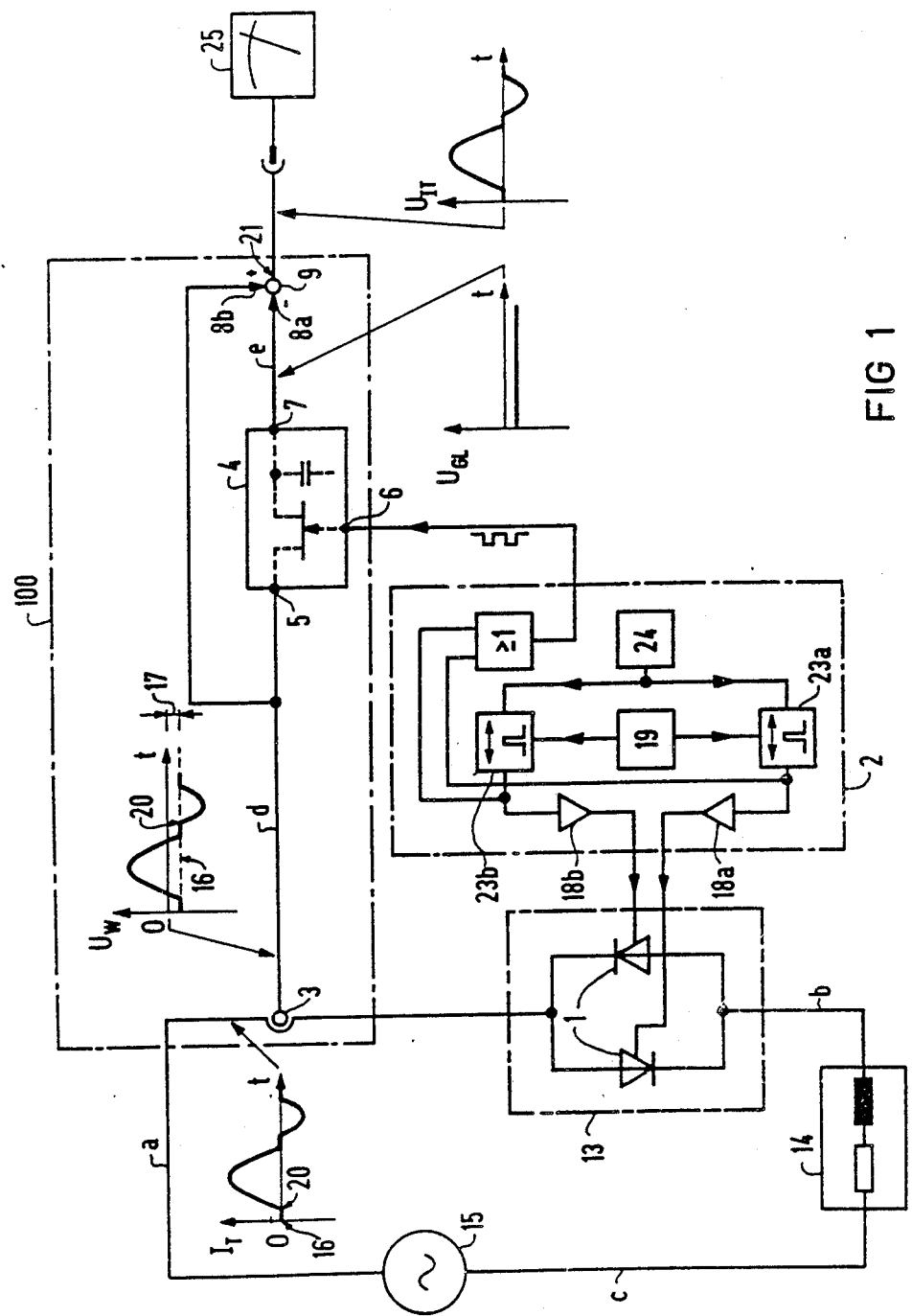

United States Patent [19]

Cavalcanti Pereira

[11] Patent Number: 4,904,925

[45] Date of Patent: Feb. 27, 1990

[54] APPARATUS FOR RECOVERING AN ALTERNATING VARIABLE OF A CONTROLLED SEMICONDUCTOR

[75] Inventor: Marcos A. Cavalcanti Pereira, Erlangen, Fed. Rep. of Germany

[73] Assignee: Siemens Aktiengesellschaft, Munich, Fed. Rep. of Germany

[21] Appl. No.: 346,478

[22] Filed: May 2, 1989

[30] Foreign Application Priority Data

May 9, 1988 [DE] Fed. Rep. of Germany ....... 3815849

[51] Int. Cl.[4] .............................................. H01F 40/06
[52] U.S. Cl. ..................................... 323/357; 323/358
[58] Field of Search ................................. 323/357, 358

[56] References Cited

U.S. PATENT DOCUMENTS

| Re. 28,851 | 6/1976 | Milkovic | 323/357 |
| 4,255,704 | 3/1981 | Milkovic | 323/357 |
| 4,255,705 | 3/1981 | Milkovic | 323/357 |
| 4,278,940 | 7/1981 | Milkovic | 323/357 |

FOREIGN PATENT DOCUMENTS 3704565 12/1987 Fed. Rep. of Germany .

OTHER PUBLICATIONS

Hewlett-Packard Journal, vol. 26, No. 6, Feb. 1977, pp. 11–18; J. E. McDermid et al., "A High-Speed System Voltmeter for Time-Related Measurements".

Primary Examiner—Patrick R. Salce
Assistant Examiner—Jeffrey Sterrett
Attorney, Agent, or Firm—Herbert L. Lerner; Laurence A. Greenberg

[57] ABSTRACT

An apparatus for recovering an alternating variable having a direct current component in a controlled semiconductor component includes an electromagnetic transducer for measurement having a secondary winding. A sample and hold element has a trigger input, an output and another input connected to the secondary winding of the transducer. A control system for the semiconductor component is connected to the trigger input for feeding trigger pulses from the control system to the trigger input at respective control times of the semiconductor component. A comparator has a first input connected to the output of the sample and hold element for receiving an output signal proportional to the direct current component, a second input connected to the secondary winding of the transducer and an output supplying the recovered alternating variable.

18 Claims, 2 Drawing Sheets

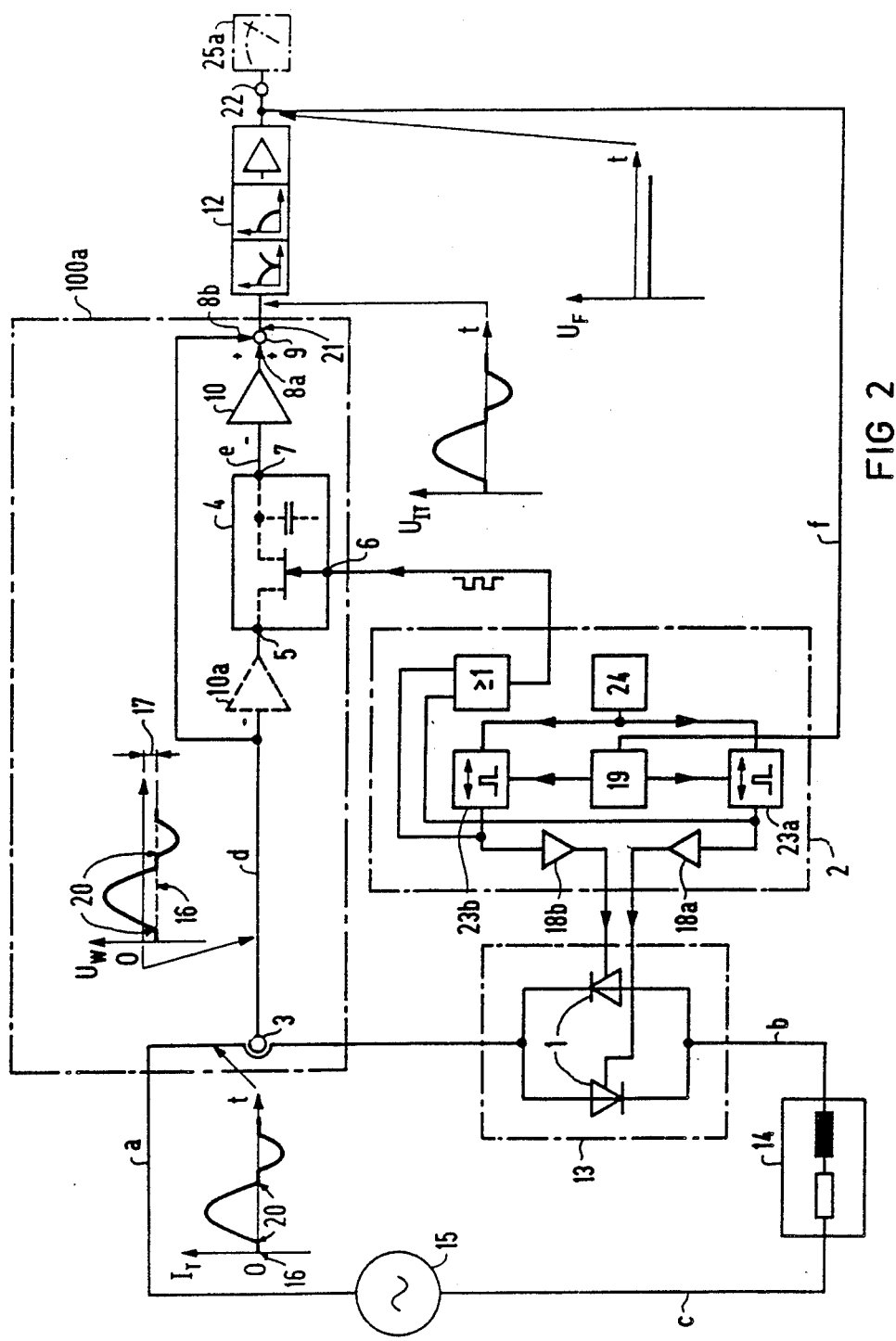

APPARATUS FOR RECOVERING AN ALTERNATING VARIABLE OF A CONTROLLED SEMICONDUCTOR

The invention relates to an apparatus for simulating an alternating variable, especially an alternating current, having a direct current component, of a controlled semiconductor component having an electromagnetic transducer for measurement purposes.

When an alternating variable is transmitted by means of an electromagnetic transducer, a steady-state direct current component is not transmitted. The consequence is a null or zero-point shift in the alternating variable emitted by the transducer as compared with the input alternating variable. This problem is particularly prevalent in measuring currents in controlled semiconductor components. For instance, a direct component can arise in the current course of a thyristor adjustor as a result of unequal ignition angles for the individual thyristors. Since the measured alternating variable is required for the control of the thyristors, it is particularly important to obtain an unadulterated value.

With special precautions, devices previously used for this purpose were capable of transmitting a direct current component. These devices included transducers with a special supplementary winding, for instance, by way of which a premagnetization of the transducer core is effected for counteracting the magnetization resulting from the direct component. Such transducers are expensive Moreover, they require additional regulating devices for the premagnetization.

It is accordingly an object of the invention to provide an apparatus for simulating an alternating variable in a controlled semiconductor, which overcomes the hereinaforementioned disadvantages of the heretofore-known devices of this general type and with which the electrical alternating variable having a direct current or DC component can be simulated in a simple manner for measurement, regulating and control functions, in a controlled semiconductor component.

With the foregoing and other objects in view there is provided, in accordance with the invention, an apparatus for simulating an alternating variable, especially an alternating current, having a direct current component of a controlled semiconductor component, comprising an electromagnetic transducer for measurement having a secondary winding, a sample and hold element having a trigger input, an output and another input connected to the secondary winding of the transducer, a control system for the semiconductor component connected to the trigger input for feeding trigger pulses from the control system to the trigger input at respective control times of the semiconductor component, and a comparator having a first input connected to the output of the sample and hold element for receiving an output signal proportional to the direct current component, a second input connected to the secondary winding of the transducer and an output supplying the recovered alternating variable.

In this way, a simulation of the required electrical alternating variable, together with its direct component, is attained with simple means. Conventional economical transducers, such as typical protective transducers, can be used for detecting the measured value. Due to their small size, these transducers additionally contribute to a substantial reduction in the amount of space required, as compared with the conventional structure having a supplementary winding. With the apparatus according to the instant application, it is possible to detect very small direct current components. Only the DC components that are steady-state and are not transmitted by the transducer are taken into account in this process.

In accordance with another feature of the invention, the comparator is a subtractor, the first input of the comparator is an inverting input, and the second input of the comparator is a non-inverting input. In this way, the simulated alternating variable (DC and AC component) also corresponds in its phase to the originating alternating variable.

This advantage is also present if in accordance with a further feature of the invention, there is provided an inverter element disposed between the sample and hold element and the comparator or at the other input of the comparator, the comparator being in the form of an analog adder.

In accordance with an added feature of the invention, the inverter element and/or the comparator is an amplifier. In this way, an adaptation of the ratios of the levels between the transducer and the elements connected to the output side thereof can thus be obtained, which makes it possible to detect even quite small DC components.

In accordance with an additional feature of the invention, there is provided a stop and low-pass filter array connected to the output of the comparator, and a measuring output connected to the stop and low-pass filter for supplying the simulated alternating variable. In this way the entire DC component contained in the alternating variable is present at the measurement output and available for further purposes. This measurement signal can advantageously be used through the control system, to regulate out the undesired direct current component.

In accordance with yet another feature of the invention, the semiconductor component includes at least one thyristor.

In accordance with yet a further feature of the invention, the semiconductor component is a component of a thyristor final control element.

In accordance with a concomitant feature of the invention, there is provided a measuring instrument connected to the measuring output for indicating a current.

Other features which are considered as characteristic for the invention are set forth in the appended claims.

Although the invention is illustrated and described herein as embodied in an apparatus for simulating an alternating variable of a controlled semiconductor, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

FIG. 1 is a schematic circuit diagram of a first apparatus for simulating the alternating current at a thyristor final control element and FIG. 2 is a diagram similar to FIG. 1 of a second such apparatus.

Referring now to the figures of the drawing in detail and first, particularly, to FIG. 1 thereof, there is seen an apparatus 100 for recovering an alternating variable of a controlled semiconductor component, in particular a thyristor. The controlled semiconductor component or thyristor is a component of a thyristor final control element 13, which forms a current circuit with lines a, b, c, a load 14 and a voltage source 15. A current $I_T$ flows through the final control element 13 as shown. It should be noted that the two half-waves are of different sizes because of unequal ignition angles, and the current source therefore has a DC component. The component should be a steady-state component. Semiconductor components 1 of the final control element 13 receive their control pulses from a control system 2. The control system 2 includes a pulse generator 24 providing output pulses which are transmitted to the controlled semiconductors 1 through angle control means 23a, 23b and adaptation stages 18a, 18b. The current $I_T$ is detected by a transducer 3.

A voltage $U_W$ at the secondary side of a transducer 3 is transmitted to a line d as shown by means of the transmission properties of the transducer 3. It can be seen that the DC component is suppressed by the transducer 3. The voltage/time areas of the positive and negative half-waves belonging to one another are of equal size. An original zero line 16 of the course of the current $I_T$ is shifted downward by an amount 17 equal to the DC component. The voltage $U_W$ is fed through the line d to one input 5 of a sample and hold element 4, having a trigger input 6 which is coupled to the control system 2.

The sample and hold element 4 receives trigger pulses from the control system 2 at each control time 20 of the semiconductor components 1. In this way it is ensured that the voltage $U_W$ is sampled at each of the control times 20 of the semiconductor components 1 and this value is emitted at an output 7 of the sample and hold element 4 until such time as a subsequent trigger pulse follows. At the control time 20, the current $I_T$ of the semiconductor components 1 is zero. If the value $U_W$ is observed at these times 20, then the amount 17 is precisely the proportion of the DC component. An output signal $U_{GL}$ of the sample and hold element 4 on a line e is accordingly proportional to the DC component. The output 7 is connected to a first input 8a of a comparator 9, having a second input 8b which is connected to the secondary winding of the transducer 3. It is advantageous for the comparator 9 to be constructed as a subtractor, with the first input 8a constructed as an inverting input and the second input 8b as a non-inverting input. This means that the DC component $U_{GL}$ is subtracted from the alternating variable $U_W$. A correct-phase replica $U_{IT}$ of the original alternating variable $I_T$ is then present at an output 21 of the comparator 9. The signal $U_{IT}$ is then used for further measurement purposes For instance, it can be transmitted to temperature monitors, monitoring and regulating devices, or to a measuring instrument 25 that displays the current value as shown.

FIG. 2 shows another exemplary embodiment in which the comparator 9 is constructed as an analog adder. In order to ensure that the direct current component will be added to the transducer signal with the correct polarity, an inverter element 10 is disposed between the sample and hold element 4 and the comparator 9. Alternatively, an inverter element 10a may be disposed at the input of the sample and hold element 4. The inverter element 10 or 10a and/or the comparator 9 are preferably constructed as amplifiers, in order to attain optimal adaptation of the various elements to one another.

A filter 12, constructed as a stop or rejection and low-pass filter, is disposed between the output 21 of the comparator 9 and a measuring output 22. The filter 12 ensures that all of the alternating current components of the voltage $U_{IT}$ are eliminated, so that a voltage $U_F$ that is proportional to the total DC component contained in the current $I_T$, is present at the measuring output 22. This voltage can, for instance, be carried by a line f to a control unit 19 of the control system 2, in order to attain an undesired DC component in the load current circuit by correcting the control instants. This is particularly important if the load 14 is inductive and an undesired premagnetization takes place. The voltage $U_F$ serves as a standard for the premagnetization. Alternatively, the voltage may also be supplied to monitoring devices or, as shown, to a measuring instrument 25a.

A substantial advantage of the apparatus 100 or 100a is that only the DC component that is not transmitted by the transducer 3 is detected by the sample and hold element 4. In other words, components that arise dynamically for brief periods, and can be transmitted to the transducer 3, are not detected by the sample and hold element 4. In contrast to the signal $U_W$, they exhibit no temporal shift in the alternating variable to the secondary side of the transducer 3. Accordingly, dynamic components are especially taken into account, and can optionally be further treated in the filter array 12.

I claim:

1. Apparatus for recovering an alternating variable having a direct current component of a controlled semiconductor component, comprising an electromagnetic transducer for measurement having a secondary winding, a sample and hold element having a trigger input, an output and another input connected to said secondary winding of said transducer, a control system for the semiconductor component connected to said trigger input for feeding trigger pulses from said control system to said trigger input at respective control times of the semiconductor component, and a comparator having a first input connected to said output of said sample and hold element for receiving an output signal proportional to the direct current component, a second input connected to said secondary winding of said transducer and an output supplying the simulated alternating variable.

2. Apparatus according to claim 1, wherein the alternating variable is an alternating current.

3. Apparatus according to claim 1, wherein said comparator is a subtractor, said first input of said comparator is an inverting input, and said second input of said comparator is a non-inverting input.

4. Apparatus according to claim 3, including a stop and low-pass filter connected to said output of said comparator, and a measuring output connected to said stop and low-pass filter for supplying the simulated alternating variable.

5. Apparatus according to claim 1, including an inverter element disposed between said sample and hold element and said comparator, said comparator being in the form of an analog adder.

6. Apparatus according to claim 5, wherein said inverter element is an amplifier.

7. Apparatus according to claim 6, including a stop and low-pass filter connected to said output of said comparator, and a measuring output connected to said stop and low-pass filter for supplying the simulated alternating variable.

8. Apparatus according to claim 1, including a stop and low-pass filter connected to said output of said comparator, and a measuring output connected to said stop and low-pass filter for supplying the simulated alternating variable.

9. Apparatus according to claim 8, including a measuring instrument connected to said measuring output for indicating a current.

10. Apparatus according to claim 8, wherein said comparator is an amplifier.

11. Apparatus according to claim 10, including a measuring instrument connected to said measuring output for indicating a current.

12. Apparatus according to claim 1, wherein said comparator is an amplifier.

13. Apparatus according to claim 12, including a measuring instrument connected to said measuring output for indicating a current.

14. Apparatus according to claim 1, wherein the semiconductor component includes at least one thyristor.

15. Apparatus according to claim 14, wherein the semiconductor component is a component of a thyristor final control element.

16. Apparatus according to claim 1, including an inverter element connected to said other input of said sample and hold element, said comparator being in the form of an analog adder.

17. Apparatus according to claim 16, wherein said inverter element is an amplifier.

18. Apparatus according to claim 17, including a stop and low-pass filter connected to said output of said comparator, and a measuring output connected to said stop and low-pass filter for supplying the simulated alternating variable.

* * * * *